(12) United States Patent
Xin et al.

(10) Patent No.: US 10,636,783 B2
(45) Date of Patent: Apr. 28, 2020

(54) ARRAY SUBSTRATE ASSEMBLY, METHOD OF MANUFACTURING ARRAY SUBSTRATE ASSEMBLY, DISPLAY PANEL AND DISPLAY APPARATUS

(71) Applicants: BOE Technology Group Co., Ltd., Beijing (CN); Ordos Yuansheng Optoelectronics Co., Ltd., Inner Mongolia (CN)

(72) Inventors: Liwen Xin, Beijing (CN); Wei Zhang, Beijing (CN); Yanshun Hao, Beijing (CN); Yezhou Fang, Beijing (CN); Guangshuai Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/977,293

(22) Filed: May 11, 2018

(65) Prior Publication Data

US 2019/0131295 A1  May 2, 2019

(30) Foreign Application Priority Data

Oct. 26, 2017 (CN) .......................... 2017 1 1026357

(51) Int. Cl.
*H01L 27/02* (2006.01)
*H01L 29/786* (2006.01)
*H01L 27/12* (2006.01)

(52) U.S. Cl.
CPC ...... *H01L 27/0292* (2013.01); *H01L 27/0288* (2013.01); *H01L 27/124* (2013.01); *H01L 27/1262* (2013.01); *H01L 29/78648* (2013.01)

(58) Field of Classification Search
CPC ..................... H01L 27/0292; H01L 27/124; H01L 27/1262
USPC .......................................................... 257/72
See application file for complete search history.

(56) References Cited

U.S. PATENT DOCUMENTS

| | | | | |
|---|---|---|---|---|
| 2014/0368749 | A1* | 12/2014 | Alonso | G02F 1/13338 349/12 |
| 2015/0311344 | A1* | 10/2015 | Wu | H01L 29/78648 257/72 |
| 2017/0031218 | A1* | 2/2017 | Li | G02F 1/136204 |

* cited by examiner

*Primary Examiner* — Tu-Tu V Ho

(74) *Attorney, Agent, or Firm* — Westman, Champlin & Koehler, P.A.

(57) ABSTRACT

An array substrate assembly, a method of manufacturing the array substrate assembly, a display panel and a display apparatus are disclosed. The array substrate assembly includes a drive control circuit located on the substrate and configured for driving. The drive control circuit includes a plurality of thin film transistors each including an active layer. The array substrate further includes a grounded electrostatic shield layer. The electrostatic shield layer is located between the substrate and the drive control circuit, and an orthogonal projection of the electrostatic shield layer on the substrate covers orthogonal projections of at least the active layers of the plurality of thin film transistors of the drive control circuit on the substrate.

20 Claims, 5 Drawing Sheets

Forming an electrostatic shield layer on a substrate by a single patterning process Forming, by a patterning process, thin film transistors of a drive control circuit on the substrate formed with the electrostatic shield layer

ARRAY SUBSTRATE ASSEMBLY, METHOD OF MANUFACTURING ARRAY SUBSTRATE ASSEMBLY, DISPLAY PANEL AND DISPLAY APPARATUS

CROSS-REFERENCE TO RELATED APPLICATION

This application claims the benefit of Chinese Patent Application No. 201711026357.7, filed with the State Intellectual Property Office of China on Oct. 26, 2017, the whole disclosure of which is incorporated herein by reference.

BACKGROUND

1. Technical Field

Embodiments of the present disclosure relate to an array substrate assembly, a method of manufacturing the array substrate assembly, a display panel and a display apparatus.

2. Description of the Related Art

With the gate-driver on array (GOA) technology, a thin film transistor (TFT) gate driver circuit is integrated in an array substrate assembly of a display panel.

The display panel is prone to generate static electricity during manufacturing and use, so that a thin film transistor in the gate driver circuit is easily damaged under the influence of the static electricity.

SUMMARY

Embodiments of the present disclosure provide an array substrate assembly comprising: a substrate; a drive control circuit located on the substrate and configured for driving, wherein the drive control circuit comprises a plurality of thin film transistors each comprising an active layer; and a grounded electrostatic shield layer, wherein the electrostatic shield layer is located between the substrate and the drive control circuit, and an orthogonal projection of the electrostatic shield layer on the substrate covers orthogonal projections of at least the active layers of the plurality of thin film transistors of the drive control circuit on the substrate.

According to embodiments of the present disclosure, the array substrate assembly further comprises: a black matrix disposed in a same layer as the electrostatic shield layer and made of a same material as the electrostatic shield layer.

According to embodiments of the present disclosure, the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

According to embodiments of the present disclosure, the electrostatic shield layer comprises a continuous part corresponding to the drive control circuit, and an orthogonal projection of the continuous part of the electrostatic shield layer on the substrate covers an orthogonal projection of the drive control circuit on the substrate.

According to embodiments of the present disclosure, the array substrate assembly further comprises: a ground wire disposed in a same layer as a source-drain layer of the thin film transistor and made of a same material as the source-drain layer of the thin film transistor; and an electrostatic connection bus disposed in a same layer as the electrostatic shield layer, made of a same material as the electrostatic shield layer, and electrically connected with the electrostatic shield layer, wherein the ground wire is electrically connected with the electrostatic connection bus through a plurality of first via holes.

According to embodiments of the present disclosure, the array substrate assembly further comprises: a ground wire disposed in a same layer as a source-drain layer of the thin film transistor and made of a same material as the source-drain layer of the thin film transistor, wherein the ground wire is electrically connected with the electrostatic shield layer through a plurality of second via holes.

According to embodiments of the present disclosure, the driver control circuit is at least one of a gate driver circuit and an emission driver circuit.

Embodiments of the present disclosure further provide a display panel comprising the abovementioned array substrate assembly.

Embodiments of the present disclosure also provide a display apparatus comprising the abovementioned display panel.

Embodiments of the present disclosure further provide a method of manufacturing an array substrate assembly, the method comprising: forming an electrostatic shield layer on a substrate; and forming thin film transistors of a drive control circuit on the substrate formed with the electrostatic shield layer, wherein the electrostatic shield layer is grounded, and an orthogonal projection of the electrostatic shield layer on the substrate covers orthogonal projections of at least active layers of the thin film transistors of the drive control circuit on the substrate.

According to embodiments of the present disclosure, the method further comprises: forming a black matrix while forming the electrostatic shield layer on the substrate.

According to embodiments of the present disclosure, the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

According to embodiments of the present disclosure, the electrostatic shield layer comprises a continuous part corresponding to the drive control circuit, and an orthogonal projection of the continuous part of the electrostatic shield layer on the substrate covers an orthogonal projection of the drive control circuit on the substrate.

According to embodiments of the present disclosure, forming the thin film transistors of the drive control circuit on the substrate formed with the electrostatic shield layer comprises: forming the active layer, a gate insulating layer, a gate, an interlayer dielectric layer, a third via hole passing through the gate insulating layer and the interlayer dielectric layer, and a source-drain layer in sequence on the substrate formed with the electrostatic shield layer, wherein a source and a drain of the source-drain layer are electrically connected with the active layer through the third via holes passing through the gate insulating layer and the interlayer dielectric layer.

According to embodiments of the present disclosure, the method further comprises: forming a buffer layer on the substrate formed with the electrostatic shield layer, after forming the electrostatic shield layer and before forming the thin film transistors of the drive control circuit.

According to embodiments of the present disclosure, the method further comprises: forming an electrostatic connection bus electrically connected with the electrostatic shield layer, while forming the electrostatic shield layer; forming a plurality of first via holes passing through the buffer layer, the gate insulating layer and the interlayer dielectric layer, while forming the third via hole passing through the gate insulating layer and the interlayer dielectric layer; and forming a ground wire while forming the source-drain layer, wherein the ground wire is electrically connected with the electrostatic connection bus through the plurality of first via holes.

According to embodiments of the present disclosure, the method further comprises: forming a plurality of second via holes passing through the buffer layer, the gate insulating layer and the interlayer dielectric layer, while forming the third via hole passing through the gate insulating layer and the interlayer dielectric layer; and forming a ground wire while forming the source-drain layer, wherein the ground wire is electrically connected with the electrostatic shield layer through the plurality of second via holes.

According to embodiments of the present disclosure, the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

According to embodiments of the present disclosure, the electrostatic shield layer comprises a continuous part corresponding to the drive control circuit, and an orthogonal projection of the continuous part of the electrostatic shield layer on the substrate covers an orthogonal projection of the drive control circuit on the substrate.

According to embodiments of the present disclosure, the driver control circuit is at least one of a gate driver circuit and an emission driver circuit.

DETAILED DESCRIPTION OF THE EMBODIMENTS

Figure 1:
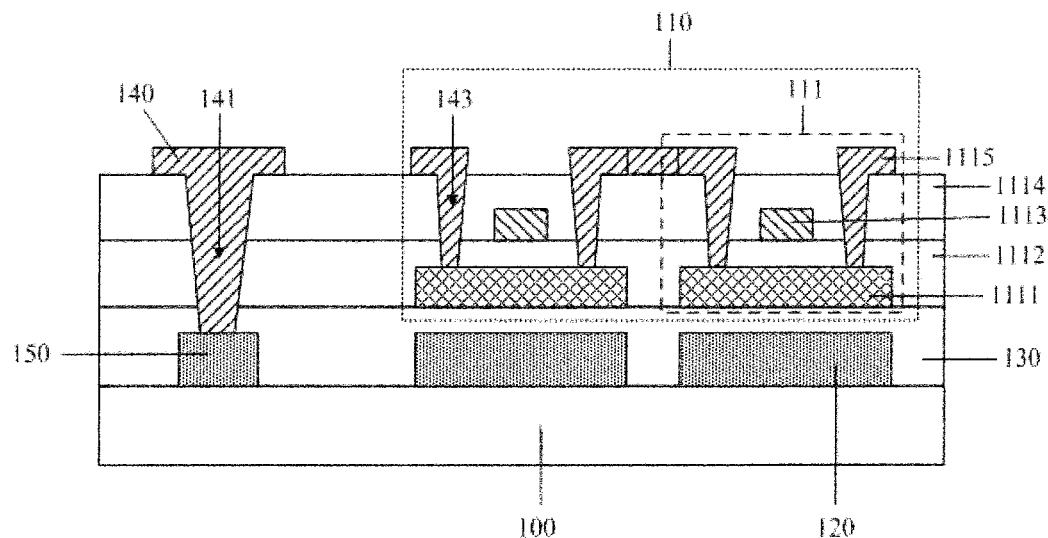
FIG. 1 is a schematic sectional view showing a configuration of an array substrate assembly according to an embodiment of the present disclosure.

In order that objects, technical solutions and advantages of the present disclosure are more apparent, a clear and detailed description of an array substrate assembly, a method of manufacturing the array substrate assembly, a display panel, and a display apparatus according to embodiments of the present disclosure will be further made as below in conjunction with the accompanying drawings. It should be understood that the embodiments set forth herein are only used to describe and explain the present disclosure and are not intended to limit the present disclosure. Furthermore, the embodiments of the present disclosure may be combined with one another unless they conflict and the features in the embodiments of the present disclosure may be combined with one another unless they conflict.

In the drawings, all of thicknesses, sizes and shapes of films do not reflect a real scale of the array substrate assembly, and the only purpose is to schematically illustrate contents of the present disclosure.

Figure 2:
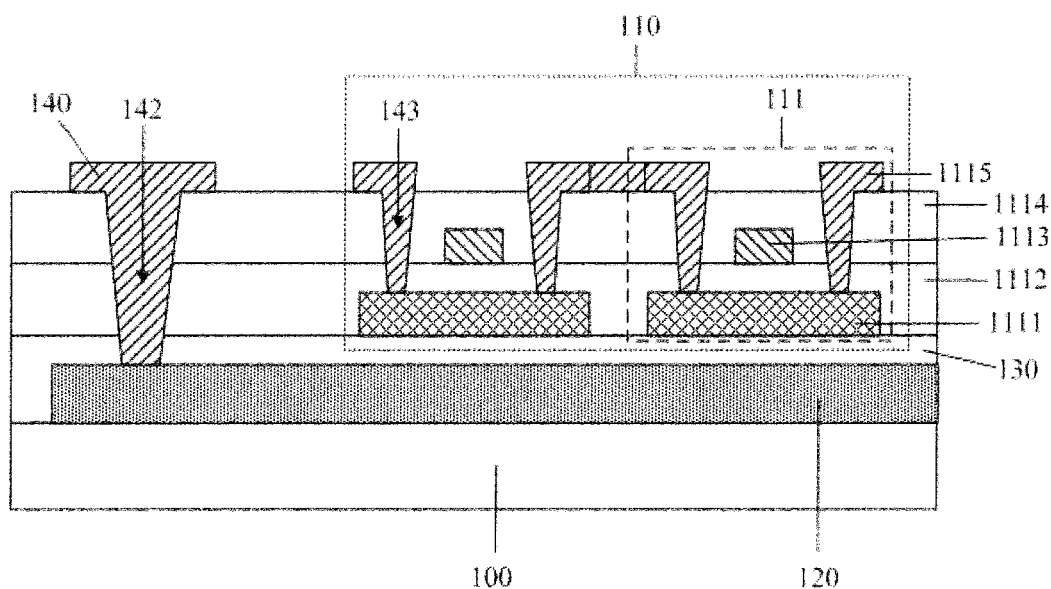
FIG. 2 is a schematic sectional view showing a configuration of an array substrate assembly according to another embodiment of the present disclosure.
Figure 3A:
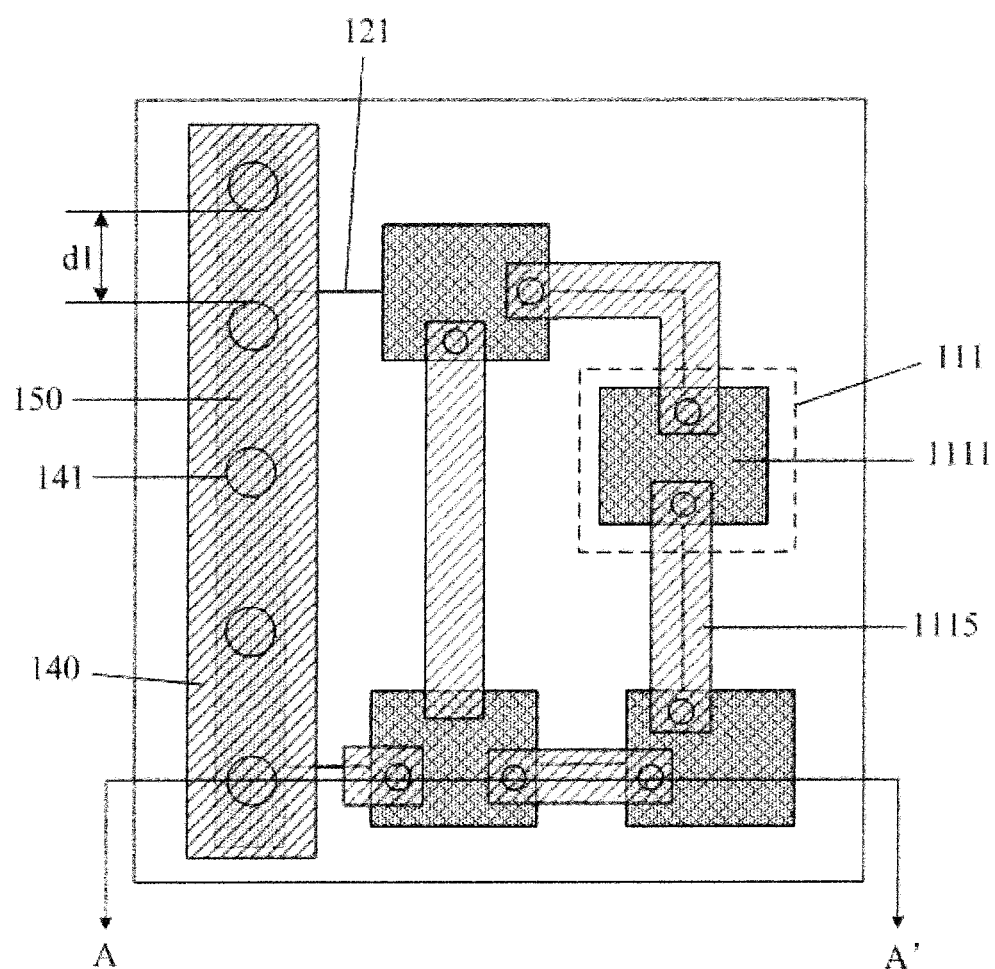
FIG. 3a is a schematic top view showing the configuration of the array substrate assembly according to the embodiment of the present disclosure.
Figures 3B, 4:
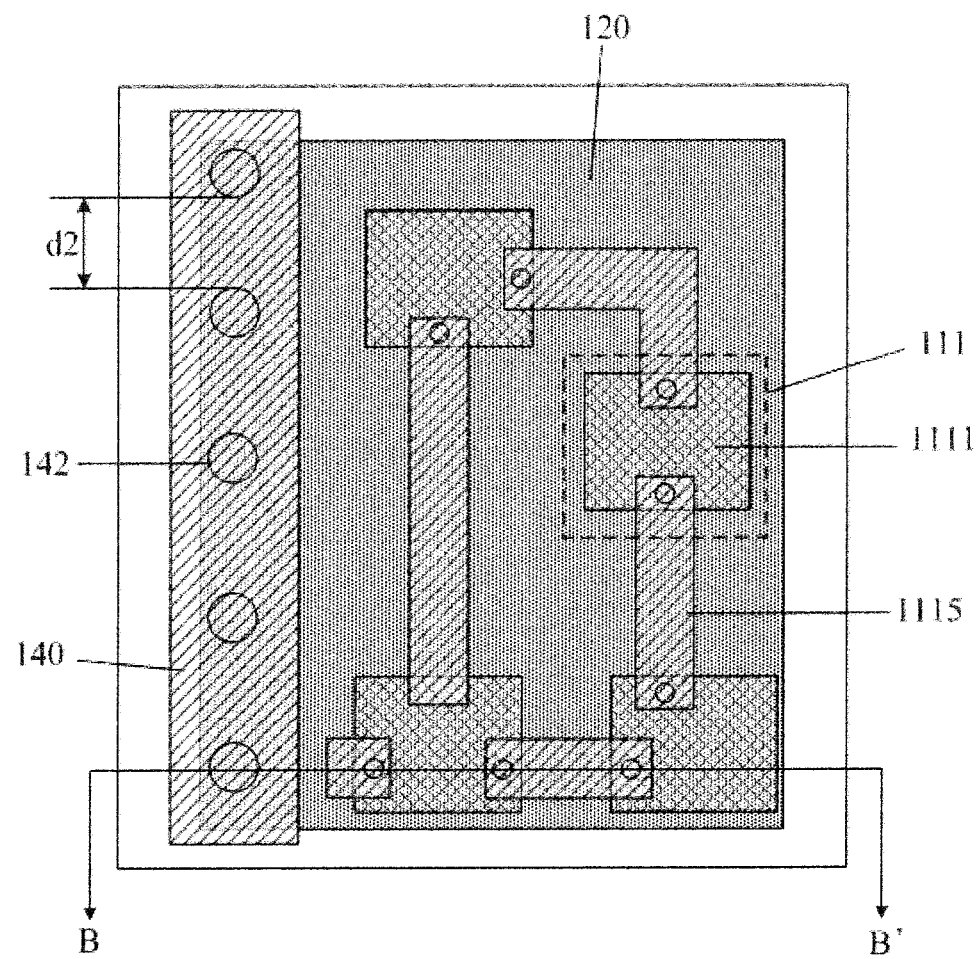
FIG. 3b is a schematic top view showing the configuration of the array substrate assembly according to the another embodiment of the present disclosure.
FIG. 4 is a flow diagram of a method of manufacturing an array substrate assembly according to an embodiment of the present disclosure.

A configuration of an array substrate assembly according to an embodiment of the present disclosure will be described as below in conjunction with FIG. 1 to FIG. 3b. FIG. 3a and FIG. 3b are schematic top views showing configurations of array substrate assemblies according to embodiments of the present disclosure, respectively, FIG. 1 is a schematic sectional view showing the configuration of the array substrate assembly and taken along the line AA' in FIG. 3a, and FIG. 2 is a schematic sectional view showing the configuration of the array substrate assembly and taken along the line BB' in FIG. 3b.

As shown in FIG. 1 to FIG. 3b, an array substrate assembly according to embodiments of the present disclosure comprises: a substrate 100; and a drive control circuit 110 located on the substrate 100 and configured for driving. The drive control circuit 110 comprises a plurality of thin film transistors 111 each comprising an active layer. The array substrate assembly further comprises: an electrostatic shield layer 120 which is grounded.

The electrostatic shield layer 120 is located between the substrate 100 and the drive control circuit 110, and an orthogonal projection of the electrostatic shield layer 120 on the substrate 100 covers orthogonal projections of at least the active layers 1111 of the plurality of thin film transistors 111 of the drive control circuit 110 on the substrate 100.

With the array substrate assembly according to the embodiments of the present disclosure, the grounded electrostatic shield layer is disposed between the substrate and the drive control circuit, and an orthogonal projection of the electrostatic shield layer on the substrate covers orthogonal projections of at least the active layers of the plurality of thin film transistors of the drive control circuit on the substrate. Thereby, when the thin film transistors of the drive control circuit and other films are manufactured on the substrate, the active layers of the thin film transistors are shielded from static electricity to avoid damage to the thin film transistors by static electricity generated by external manufacturing equipment in a manufacturing process of the array substrate assembly.

In some embodiments, the drive control circuit may further comprise devices such as a capacitor. A display panel comprising the array substrate assembly according to the embodiments of the present disclosure is driven to perform a display by the drive control circuit. In the array substrate assembly according to the embodiments of the present disclosure, the driver control circuit may be a gate driver circuit configured to supply a gate scanning signal to a control transistor. Alternatively, the driver control circuit may also be an emission driver circuit configured to supply a light emission controlling signal to a light emission controlling transistor. The display panel may comprise a display region configured to display an image, and a non-display region outside the display region. The driver control circuit may be disposed in the non-display region of the display panel.

Furthermore, the array substrate assembly according to the embodiments of the present disclosure may comprise two drive control circuits. One of the two drive control circuits is a gate driver circuit, while the other is an emission driver circuit.

In the above array substrate assembly according to the embodiments of the present disclosure, as shown in FIG. 1 and FIG. 2, the array substrate assembly may further comprise: a buffer layer 130 disposed between the drive control circuit 110 and the electrostatic shield layer 120. The thin film transistor 111 of the drive control circuit 110 may comprise: an active layer 1111, a gate insulating layer 1112, a gate 1113, an interlayer dielectric layer 1114, and a source-drain layer 1115, which are disposed in sequence on the buffer layer 130. The source-drain layer 1115 is electrically connected with the active layer 1111 through a third via hole 143 passing through the gate insulating layer 1112 and the interlayer dielectric layer 1114. In actual applications, some of the thin film transistors need to be electrically connected with one another to transmit a signal. Some of the thin film transistors may be electrically connected with one another by electrically connecting their source electrodes and drain electrodes.

In order to avoid light leakage, generally a black matrix configured to block light is disposed. In some embodiments, in the above array substrate assembly according to the embodiments of the present disclosure, the array substrate assembly may further comprise a black matrix. The black matrix may be disposed in any other region, in which light needs to be blocked, than a region in which the electrostatic shield layer is located, or the black matrix may also be configured to delimit regions in which pixel units in the display region of the array substrate assembly are located. The electrostatic shield layer may be disposed in a same layer as the black matrix and may be made of a same material as the black matrix. In other words, the electrostatic shield layer serves as the black matrix to block light. In this way, when the array substrate assembly is manufactured, only a process originally used for manufacturing the black matrix of the array substrate assembly may be used to manufacture the electrostatic shield layer without needing an extra step for manufacturing the electrostatic shield layer, so that manufacturing cost can be saved and added value of a product is increased. In some embodiments, the electrostatic shield layer may be made of a metal material. For example, the electrostatic shield layer may be made of one of molybdenum, titanium, and aluminum, or a combination of molybdenum, titanium, and aluminum.

In some embodiments, in the above array substrate assembly according to the embodiments of the present disclosure, as shown in FIG. 1 and FIG. 3a, the electrostatic shield layer 120 comprises a plurality of discrete parts corresponding to the active layers 1111 of the plurality of thin film transistors 111 of the drive control circuit 110, and an orthogonal projection of the electrostatic shield layer 120 on the substrate 100 covers orthogonal projections of the active layers 1111 of the plurality of thin film transistors 111 of the drive control circuit 110 on the substrate 100. Further, the plurality of discrete parts of the electrostatic shield layer 120 corresponding to the active layers 1111 of the plurality of thin film transistors 111 may be electrically connected and grounded through a connection wiring 121, so that the electrostatic shield layer is grounded.

Alternatively, in some embodiments, as shown in FIG. 2 and FIG. 3b, the electrostatic shield layer 120 may also comprise a continuous part corresponding to the drive control circuit 110. In other words, the orthogonal projection of the electrostatic shield layer 120 on the substrate 100 covers the orthogonal projection of the entire drive control circuit 110 on the substrate 100.

In some embodiments, in the above array substrate assembly according to the embodiments of the present disclosure, as shown in FIG. 1, in the case where the electrostatic shield layer 120 comprises the plurality of discrete parts, the array substrate assembly may further comprise: a ground wire 140 disposed in a same layer as a source-drain layer 1115 of the thin film transistors 111 and made of a same material as the source-drain layer 1115 of the thin film transistors 111; and an electrostatic connection bus 150 disposed in a same layer as the electrostatic shield layer 120, made of a same material as the electrostatic shield layer 120, and electrically connected with the electrostatic shield layer 120. Furthermore, the ground wire 140 is electrically connected with the electrostatic connection bus 150 through a plurality of first via holes 141. The ground wire 140 is configured to be grounded. The plurality of discrete parts of the electrostatic shield layer 120 corresponding to the active layers 1111 of the plurality of thin film transistors 111 are electrically connected through the connection wiring 121, and may also be electrically connected with the electrostatic connection bus 150 through the connection wiring 121, so that the electrostatic shield layer 120 is electrically connected with the ground wire 140 through the electrostatic connection bus 150, thereby shielding against static electricity. In addition, the first via holes 141 pass through the buffer layer 130, the gate insulating layer 1112 and the interlayer dielectric layer 1114.

In some embodiments, in the above array substrate assembly according to the embodiments of the present disclosure, as shown in FIG. 3a, distances d1 between adjacent first via holes 141 are equal to one another so that the first via holes 141 are distributed uniformly in the array substrate assembly. Of course, the first via holes may also be arranged in any other manner in the array substrate assembly and there is no limitation on an arrangement of the first via holes herein.

In some embodiments, in the above array substrate assembly according to the embodiments of the present disclosure, as shown in FIG. 2, in the case where the electrostatic shield layer 120 comprises a continuous part corresponding to the drive control circuit 110, the array substrate assembly may further comprise: a ground wire 140 disposed in a same layer as a source-drain layer 1115 of the thin film transistors 111 and made of a same material as the source-drain layer 1115 of the thin film transistors 111, and the ground wire 140 is electrically connected with the electrostatic shield layer 120 through a plurality of second via holes 142. The ground wire 140 is configured to be grounded, so that the electrostatic shield layer 120 is grounded through the ground wire 140, thereby shielding against static electricity.

In some embodiments, in the above array substrate assembly according to the embodiments of the present disclosure, as shown in FIG. 3b, distances d2 between every two adjacent second via holes 142 are equal to one another so that the second via holes 142 are distributed uniformly in the array substrate assembly. Of course, the second via holes may also be arranged in any other manner in the array substrate assembly and there is no limitation on an arrangement of the second via holes herein.

Based on the same inventive concept, embodiments of the present disclosure also provide a method of manufacturing an array substrate assembly. As shown in FIG. 4, the manufacturing method may comprise:

a step S401 of forming an electrostatic shield layer on a substrate by a single patterning process; and a step S402 of forming, by a patterning process, thin film transistors of a drive control circuit on the substrate formed with the electrostatic shield layer. The electrostatic shield layer is grounded, and an orthogonal projection of the electrostatic shield layer on the substrate covers orthogonal projections of at least active layers of the thin film transistors of the drive control circuit on the substrate.

With the method of manufacturing the array substrate assembly according to the embodiments of the present disclosure, the electrostatic shield layer is first formed on the substrate; and then the thin film transistors of the drive control circuit are formed on the substrate formed with the electrostatic shield layer, and the orthogonal projection of the electrostatic shield layer on the substrate covers the orthogonal projections of at least the active layers of the thin film transistors of the drive control circuit on the substrate. Thereby, when the thin film transistors of the drive control circuit and other films are manufactured on the substrate, the active layers of the thin film transistors are shielded from static electricity to avoid damage to the thin film transistors by static electricity generated by external production equipment in a manufacturing process of the array substrate assembly.

In the method of manufacturing the array substrate assembly according to the embodiments of the present disclosure, the patterning process may comprise only a photolithographic process, or may comprise the photolithographic process and an etching step and may further comprise other processes for forming a predetermined pattern, such as a printing process, an ink-jetting process, an evaporation process, or the like. The photolithographic process is a process which includes steps such as a film forming process, an exposure, a development, and the like, and which is used for forming a pattern by a photoresist, a mask, an exposing machine and the like. A corresponding patterning process may be selected according to a structure to be formed in the present disclosure.

In some embodiments, the method of manufacturing the array substrate assembly according to the embodiments of the present disclosure further comprises forming a black matrix while forming the electrostatic shield layer on the substrate by a single patterning process. The black matrix may be disposed in any other region, in which light needs to be blocked, than a region in which the electrostatic shield layer is located, or the black matrix is configured to delimit regions in which pixel units in the display region of the array substrate assembly are located.

In some embodiments, the method of manufacturing the array substrate assembly according to the embodiments of the present disclosure may further comprise forming a buffer layer on the substrate formed with the electrostatic shield layer, after forming the electrostatic shield layer and before forming the thin film transistors of the drive control circuit.

In some embodiments, in the method of manufacturing the array substrate assembly according to the embodiments of the present disclosure, forming, by the patterning process, the thin film transistors of the drive control circuit on the substrate formed with the electrostatic shield layer may comprise:

forming, by a single patterning process, each of the active layer, a gate insulating layer, a gate, an interlayer dielectric layer, a third via hole passing through the gate insulating layer and the interlayer dielectric layer, and a source-drain layer in sequence on the substrate, respectively. A source and a drain of the source-drain layer are electrically connected with the active layer through the third via holes passing through the gate insulating layer and the interlayer dielectric layer.

In some embodiments, in the method of manufacturing the array substrate assembly according to the embodiments of the present disclosure, the formed electrostatic shield layer may comprise a plurality of discrete parts, and an orthogonal projection of the electrostatic shield layer on the substrate covers orthogonal projections of the active layers of the plurality of thin film transistors of the drive control circuit on the substrate, or orthogonal projections of the plurality of discrete parts of the electrostatic shield layer on the substrate cover orthogonal projections of the active layers of the plurality of thin film transistors of the drive control circuit on the substrate. Alternatively, the formed electrostatic shield layer may also comprise a continuous part corresponding to the drive control circuit, and an orthogonal projection of the continuous part of the electrostatic shield layer on the substrate covers an orthogonal projection of the drive control circuit on the substrate.

In some embodiments, the method of manufacturing the array substrate assembly according to the embodiments of the present disclosure further comprises forming an electrostatic connection bus electrically connected with the electrostatic shield layer, while forming the electrostatic shield layer.

Further, the method of manufacturing the array substrate assembly according to the embodiments of the present disclosure further comprises forming a plurality of first via holes passing through the buffer layer, the gate insulating layer and the interlayer dielectric layer, while forming the third via hole passing through the gate insulating layer and the interlayer dielectric layer.

Further, the method of manufacturing the array substrate assembly according to the embodiments of the present disclosure further comprises forming a ground wire while forming the source-drain layer. The ground wire is electrically connected with the electrostatic connection bus through the plurality of first via holes.

Alternatively, in some embodiments, the method of manufacturing the array substrate assembly according to the embodiments of the present disclosure further comprises forming a plurality of second via holes passing through the buffer layer, the gate insulating layer and the interlayer dielectric layer, while forming the third via hole passing through the gate insulating layer and the interlayer dielectric layer.

Further, the method of manufacturing the array substrate assembly according to the embodiments of the present disclosure further comprises forming a ground wire while forming the source-drain layer. The ground wire is electrically connected with the electrostatic shield layer through the plurality of second via holes.

In some embodiments, in the method of manufacturing the array substrate assembly according to the embodiments of the present disclosure, the formed driver control circuit may be a gate driver circuit, or the formed driver control circuit may also be an emission driver circuit. Of course, two drive control circuits may be formed. One of the two drive control circuits is a gate driver circuit, while the other is an emission driver circuit.

In some embodiments, in the method of manufacturing the array substrate assembly according to the embodiments of the present disclosure, the first via holes, the second via holes and the third via holes are formed by dry etching. For example, dry etching may comprise plasma etching (PE), reactive ion etching (RIE), and inductively coupled plasma (ICP) etching.

A method of manufacturing an array substrate assembly according to an embodiment of the present disclosure will be described as below by taking as an example a formation of the structure of the array substrate assembly shown in FIG. 1.

A method of manufacturing the array substrate assembly shown in FIG. 1 may comprise the following steps.

Figure 5A:
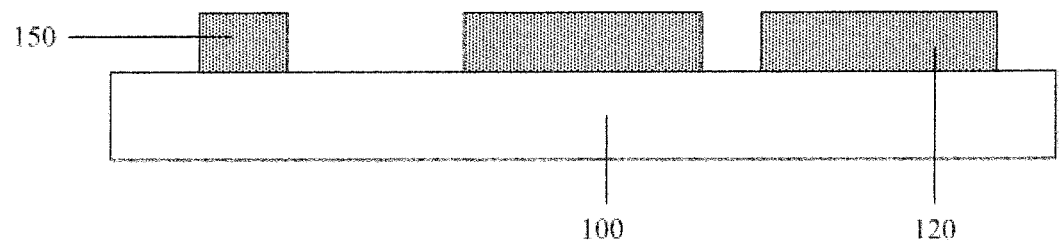
FIG. 5a to FIG. 5f are schematic sectional views showing configurations of an array substrate assembly formed after performing steps according to embodiments of the present disclosure, respectively.

(1) An electrostatic shield layer 120, a black matrix and an electrostatic connection bus 150 are formed on a substrate 100 by a single patterning process, as shown in FIG. 5*a*. Specifically, a molybdenum film is deposited on a substrate by a magnetron sputtering device, and a photoresist is coated on the molybdenum film, and then is exposed and developed in sequence. After that, an electrostatic shield layer, a black matrix and an electrostatic connection bus are formed.

Figure 5B:
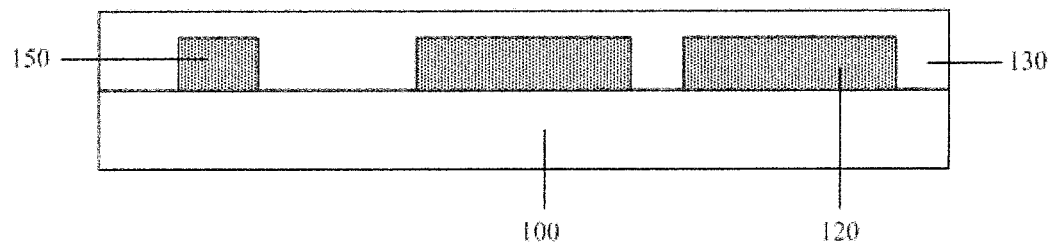

(2) A buffer layer 130 is deposited on the substrate 100 formed with the electrostatic shield layer 120, the black matrix and the electrostatic connection bus 150, as shown in FIG. 5*b*.

Figure 5C:
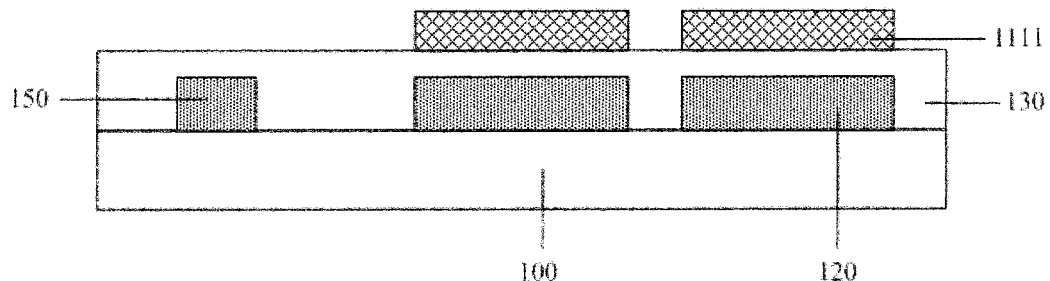

(3) An active layer 1111 is formed on the substrate 100 formed with the buffer layer 130, by a single patterning process, as shown in FIG. 5*c*.

Figure 5D:
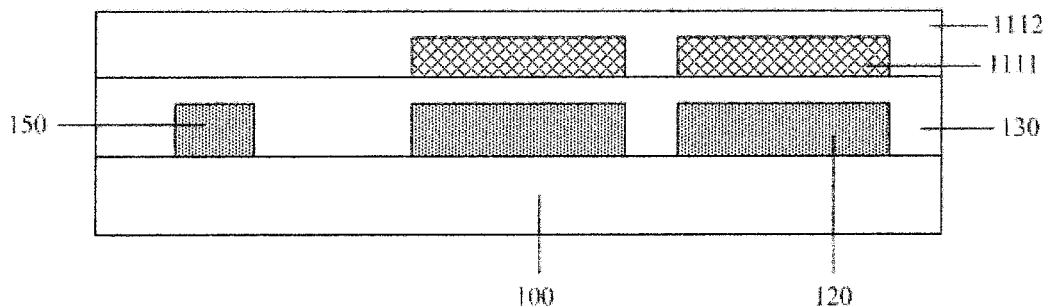

(4) A gate insulating layer 1112 is formed on the substrate 100 formed with the active layer 1111, by a single patterning process, as shown in FIG. 5*d*.

Figure 5E:
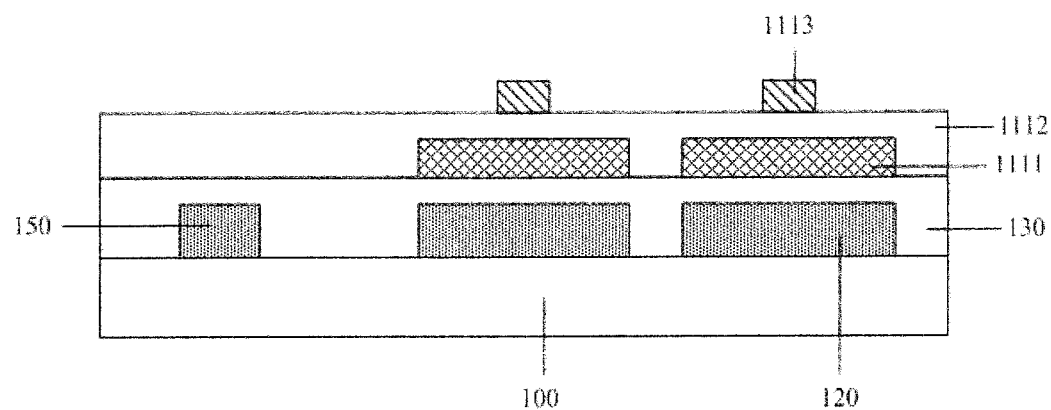

(5) A gate 1113 is formed on the substrate 100 formed with the gate insulating layer 1112, by a single patterning process, as shown in FIG. 5*e*.

Figure 5F:
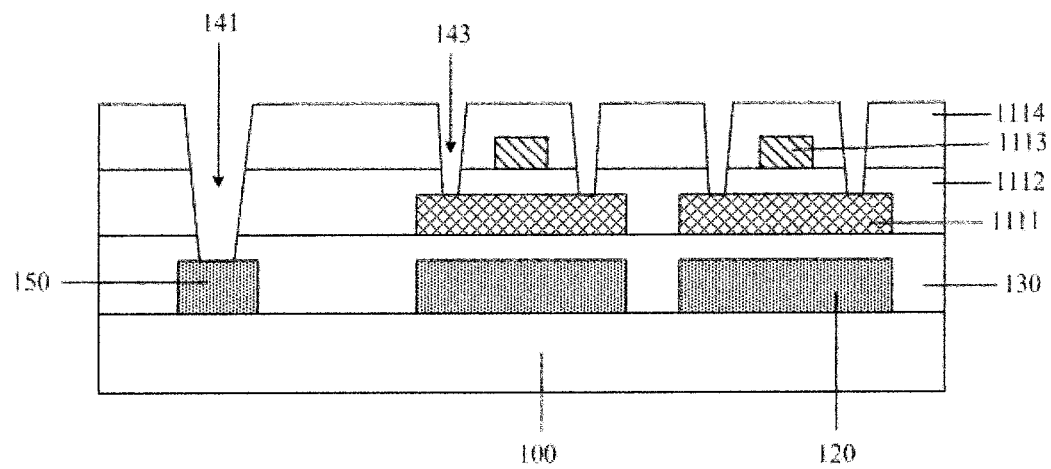

(6) An interlayer dielectric layer 1114, a first via hole 141 passing through the buffer layer 130, the gate insulating layer 1112 and the interlayer dielectric layer 1114, and a third via hole 143 passing through the gate insulating layer 1112 and the interlayer dielectric layer 1114 are formed on the substrate 100 formed with the gate 1113, by a single patterning process, as shown in FIG. 5*f*.

(7) A source-drain layer 1115 and a ground wire 140 are formed on the substrate 100 formed with the interlayer dielectric layer 1114. The source-drain layer 1115 comprises a source and a drain of the thin film transistor. The source and the drain of the thin film transistor are electrically connected with the active layer 1111 of the thin film transistor through the third via holes 143, as shown in FIG. 1.

Based on the same inventive concept, embodiments of the present disclosure also provide a display panel comprising the array substrate according to any one of the embodiments of the present disclosure. Since principles of the display panel for solving a problem are similar to those of the array substrate assembly, the implementations of the above array substrate assembly may be referred to for implementations of the display panel, and repeated contents are no longer described herein for the sake of brevity.

In some embodiments, the above display panel according to the embodiments of the present disclosure may be a liquid crystal display panel, or may also be an organic light-emitting diode display panel, and the display panel according to the embodiments of the present disclosure is not limited to those described in the embodiments.

In the liquid crystal display panel, generally a pixel unit of an array substrate assembly comprises a pixel electrode and a switch transistor connected with the pixel electrode. In some embodiments, in the case where the above display panel according to the embodiments of the present disclosure is a liquid crystal display panel, the driver control circuit of the array substrate assembly may be a gate driver circuit configured to supply a gate scanning signal to the switch transistor. Generally, the liquid crystal display panel comprises an array substrate assembly and an opposite substrate assembly which are opposite to each other, and a liquid crystal layer disposed between the array substrate assembly and the opposite substrate assembly. Generally, a seal adhesive is applied between the array substrate assembly and the opposite substrate assembly when the liquid crystal display panel is assembled, and is cured by ultraviolet rays after the liquid crystal display panel has been assembled, so that the array substrate assembly and the opposite substrate assembly are bonded together. Generally, the seal adhesive is located in a non-display region where the driver control circuit is disposed. In order to prevent the electrostatic shield layer from completely blocking the ultraviolet rays in the case where the ultraviolet rays are irradiated from a side of the array substrate assembly away from the opposite substrate assembly, the electrostatic shield layer may comprise the plurality of discrete parts. Of course, the ultraviolet rays may also be irradiated from a side of the opposite substrate assembly away from the array substrate assembly. In this case, the electrostatic shield layer may comprise the continuous part corresponding to the drive control circuit.

Generally, an organic light-emitting diode display panel comprises a plurality of organic light-emitting diodes and a pixel compensation circuit connected with the organic light-emitting diodes. Generally, a pixel compensation circuit comprises a light emission controlling transistor configured to control the organic light-emitting diode to emit light, and a scan control transistor configured to control an input of a data signal. In some embodiments, in the case where the above display panel according to the embodiments of the present disclosure is an organic light-emitting diode display panel, the driver control circuit may be an emission driver circuit configured to supply a light emission controlling signal to a light emission controlling transistor, or the driver control circuit may also be a gate driver circuit configured to supply a gate scanning signal to a scan control transistor. Of course, the organic light-emitting diode display panel may also comprise two drive control circuits. One of the two driver control circuits may be an emission driver circuit configured to supply a light emission controlling signal to a light emission controlling transistor, while the other of the two driver control circuits may be a gate driver circuit configured to supply a gate scanning signal to a scan control transistor. The driver control circuit is not limited to those described in the embodiments of the present disclosure.

Based on the same inventive concept, embodiments of the present disclosure also provide a display apparatus comprising the above display panel according to the embodiments of the present disclosure. The display apparatus may comprise any products or parts having a displaying function, such as a mobile phone, a tablet computer, a TV, a display, a notebook computer, a digital frame, and a navigator. Other indispensable components of the display apparatus will be understood by those skilled in the art, are no longer described herein for the sake of brevity, and should not be construed to limit the present disclosure. The embodiments of the array substrate assembly may be referred to for implementations of the display apparatus and repeated contents are no longer described for the sake of brevity.

With the array substrate assembly, the method of manufacturing the array substrate assembly, the display panel and the display apparatus according to embodiments of the present disclosure, the grounded electrostatic shield layer is disposed between the substrate and the drive control circuit, and an orthogonal projection of the electrostatic shield layer on the substrate covers orthogonal projections of at least the active layers of the plurality of thin film transistors of the drive control circuit on the substrate. Thereby, when the thin film transistors of the drive control circuit and other films are manufactured on the substrate, the active layers of the thin film transistors are shielded from static electricity to avoid damage to the thin film transistors by static electricity generated by external production equipment in a manufacturing process of the array substrate assembly.

While the configuration of the drive control circuit has been described and illustrated, the configuration of the drive control circuit is not limited to the above configurations and the drive control circuit may have any appropriate configurations as long as the drive control circuit has an active layer.

Apparently, various changes and modifications to the present disclosure may be made by those skilled in the art without departing from the spirit and scope of the disclosure. Therefore, if these amendments and modifications to the present disclosure belong to the scope defined in the appended claims of the present disclosure and their equivalents, the present disclosure is intended to include the changes and modifications.

What is claimed is:

1. An array substrate assembly, comprising:
   a substrate;
   a drive control circuit located on the substrate and configured for driving, wherein the drive control circuit comprises a plurality of thin film transistors each comprising an active layer; and
   an electrostatic shield layer, wherein the electrostatic shield layer is located between the substrate and the drive control circuit, the electrostatic shield layer is grounded to prevent static electricity from entering the active layers of the plurality of thin film transistors of the drive control circuit, and orthogonal projections of at least the active layers of the plurality of thin film transistors of the drive control circuit on the substrate are located within an orthogonal projection of the electrostatic shield layer on the substrate, so that the active layers of the thin film transistors of the drive control circuit are shielded from static electricity at least during manufacturing the array substrate assembly.

2. The array substrate assembly of claim 1, further comprising:
   a black matrix disposed in a same layer as the electrostatic shield layer and made of a same material as the electrostatic shield layer.

3. The array substrate assembly of claim 1, wherein:
   the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

4. The array substrate assembly of claim 1, wherein:
   the electrostatic shield layer comprises a continuous part corresponding to the drive control circuit, and an orthogonal projection of the continuous part of the electrostatic shield layer on the substrate covers an orthogonal projection of the drive control circuit on the substrate.

5. The array substrate assembly of claim 3, further comprising:
   a ground wire disposed in a same layer as a source-drain layer of the thin film transistor and made of a same material as the source-drain layer of the thin film transistor; and an electrostatic connection bus disposed in a same layer as the electrostatic shield layer, made of a same material as the electrostatic shield layer, and electrically connected with the electrostatic shield layer,
   wherein the ground wire is electrically connected with the electrostatic connection bus through a plurality of first via holes.

6. The array substrate assembly of claim 4, further comprising:
   a ground wire disposed in a same layer as a source-drain layer of the thin film transistor and made of a same material as the source-drain layer of the thin film transistor,
   wherein the ground wire is electrically connected with the electrostatic shield layer through a plurality of second via holes.

7. The array substrate assembly of claim 1, wherein:
   the driver control circuit is at least one of a gate driver circuit and an emission driver circuit.

8. A display panel comprising:
   the array substrate assembly according to claim 1.

9. A display apparatus comprising:
   the display panel according to claim 8.

10. A method of manufacturing an array substrate assembly, comprising:
    forming an electrostatic shield layer on a substrate; and
    forming thin film transistors of a drive control circuit on the substrate formed with the electrostatic shield layer, wherein each of the thin film transistors comprises an active layer, the electrostatic shield layer is grounded to prevent static electricity from entering the active layers of the thin film transistors of the drive control circuit, and orthogonal projections of at least the active layers of the thin film transistors of the drive control circuit on the substrate are located within an orthogonal projection of the electrostatic shield layer on the substrate, so that the active layers of the thin film transistors of the drive control circuit are shielded from static electricity at least during manufacturing the array substrate assembly.

11. The method of claim 10, further comprising:
    forming a black matrix while forming the electrostatic shield layer on the substrate.

12. The method of claim 10, wherein:
    the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

13. The method of claim 10, wherein:
    the electrostatic shield layer comprises a continuous part corresponding to the drive control circuit, and an orthogonal projection of the continuous part of the electrostatic shield layer on the substrate covers an orthogonal projection of the drive control circuit on the substrate.

14. The method of claim 10, wherein:
    the driver control circuit is at least one of a gate driver circuit and an emission driver circuit.

15. A method of manufacturing an array substrate assembly, comprising:
    forming an electrostatic shield layer on a substrate; and
    forming thin film transistors of a drive control circuit on the substrate formed with the electrostatic shield layer, wherein the electrostatic shield layer is grounded, and an orthogonal projection of the electrostatic shield layer on the substrate covers orthogonal projections of at least active layers of the thin film transistors of the drive control circuit on the substrate, so that the active layers of the thin film transistors of the drive control circuit are shielded from static electricity at least during manufacturing the array substrate assembly, wherein forming the thin film transistors of the drive control circuit on the substrate formed with the electrostatic shield layer comprises:

forming the active layer, a gate insulating layer, a gate, an interlayer dielectric layer, a third via hole passing through the gate insulating layer and the interlayer dielectric layer, and a source-drain layer in sequence on the substrate formed with the electrostatic shield layer, wherein a source and a drain of the source-drain layer are electrically connected with the active layer through the third via holes passing through the gate insulating layer and the interlayer dielectric layer.

16. The method of claim 15, further comprising:

forming a buffer layer on the substrate formed with the electrostatic shield layer, after forming the electrostatic shield layer and before forming the thin film transistors of the drive control circuit.

17. The method of claim 16, further comprising:

forming an electrostatic connection bus electrically connected with the electrostatic shield layer, while forming the electrostatic shield layer;

forming a plurality of first via holes passing through the buffer layer, the gate insulating layer and the interlayer dielectric layer, while forming the third via hole passing through the gate insulating layer and the interlayer dielectric layer; and forming a ground wire while forming the source-drain layer, wherein the ground wire is electrically connected with the electrostatic connection bus through the plurality of first via holes.

18. The method of claim 16, further comprising:

forming a plurality of second via holes passing through the buffer layer, the gate insulating layer and the interlayer dielectric layer, while forming the third via hole passing through the gate insulating layer and the interlayer dielectric layer; and forming a ground wire while forming the source-drain layer, wherein the ground wire is electrically connected with the electrostatic shield layer through the plurality of second via holes.

19. The method of claim 17, wherein:

the electrostatic shield layer comprises a plurality of discrete parts, and orthogonal projections of the plurality of discrete parts of the electrostatic shield layer on the substrate cover orthogonal projections of the active layers of the plurality of thin film transistors of the drive control circuit on the substrate, respectively.

20. The method of claim 18, wherein:

the electrostatic shield layer comprises a continuous part corresponding to the drive control circuit, and an orthogonal projection of the continuous part of the electrostatic shield layer on the substrate covers an orthogonal projection of the drive control circuit on the substrate.

* * * * *